United States Patent
Gao (10) Patent No.: US 11,830,577 B2
(45) Date of Patent: Nov. 28, 2023

(54) FIRST IN FIRST OUT MEMORY AND MEMORY DEVICE

(71) Applicant: CHANGXIN MEMORY TECHNOLOGIES, INC., Anhui (CN)

(72) Inventor: Enpeng Gao, Shangghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 178 days.

(21) Appl. No.: 17/446,984

(22) Filed: Sep. 6, 2021

(65) Prior Publication Data

US 2022/0051707 A1    Feb. 17, 2022

Related U.S. Application Data

(63) Continuation of application No. PCT/CN2021/101000, filed on Jun. 18, 2021.

(30) Foreign Application Priority Data

Aug. 12, 2020    (CN) .......................... 202010806232.1

(51) Int. Cl.
G11C 8/00  (2006.01)
G11C 7/22  (2006.01)
G11C 7/10  (2006.01)

(52) U.S. Cl.
CPC ............ *G11C 7/222* (2013.01); *G11C 7/1039* (2013.01); *G11C 7/1069* (2013.01); *G11C 7/1096* (2013.01)

(58) Field of Classification Search
CPC .................................................... G11C 7/222
See application file for complete search history.

(56) References Cited

U.S. PATENT DOCUMENTS

| | | | |
|---|---|---|---|
| 5,699,530 A * | 12/1997 | Rust | G06F 5/16 365/189.04 |
| 5,914,906 A | 6/1999 | Iadanza | |
| 5,949,719 A | 9/1999 | Iadanza | |
| 6,023,421 A | 2/2000 | Iadanza | |
| 6,038,192 A | 3/2000 | Clinton | |
| 6,044,031 A | 3/2000 | Iadanza | |
| 6,075,745 A | 6/2000 | Gould | |
| 6,091,645 A | 7/2000 | Iadanza | |
| 6,118,707 A | 9/2000 | Gould | |
| 6,130,854 A | 10/2000 | Gould | |
| 6,233,191 B1 | 5/2001 | Gould | |
| 8,036,059 B2 | 10/2011 | Dietrich | |

(Continued)

FOREIGN PATENT DOCUMENTS

| CN | 1159060 A | 9/1997 |
|---|---|---|
| CN | 1121648 C | 9/2003 |

(Continued)

*Primary Examiner* — Hoai V Ho
(74) *Attorney, Agent, or Firm* — SYNCODA LLC; Feng Ma (57) ABSTRACT

A First In First Out (FIFO) memory includes storage units. Outputs of the storage units are connected to one node. The storage unit includes storage sub-units, a selector, and a drive. An input of the selector is connected to outputs of the storage sub-units. An input of the drive is connected to an output of the selector. Driven by a first pointer signal, the storage sub-units receive storage data. Driven by a second pointer signal, the drive outputs the storage data.

17 Claims, 10 Drawing Sheets

(56) References Cited

U.S. PATENT DOCUMENTS

| | | |
|---|---|---|
| 2003/0052708 A1 | 3/2003 | Momtaz |
| 2004/0156250 A1 | 8/2004 | Momtaz |
| 2004/0158657 A1 | 8/2004 | Momtaz |
| 2005/0117428 A1 | 6/2005 | Momtaz |
| 2005/0122815 A1 | 6/2005 | Momtaz |
| 2005/0128846 A1 | 6/2005 | Momtaz |
| 2007/0214335 A1* | 9/2007 | Bellows ............... G11C 7/1042 711/167 |

FOREIGN PATENT DOCUMENTS

| | | |
|---|---|---|
| CN | 1627438 B | 5/2010 |
| CN | 102880441 A | 1/2013 |
| CN | 102880442 A | 1/2013 |
| CN | 212364988 U | 1/2021 |

* cited by examiner

FIG. 12

FIRST IN FIRST OUT MEMORY AND MEMORY DEVICE

CROSS-REFERENCE TO RELATED APPLICATIONS

This is a continuation application of International Patent Application No. PCT/CN2021/101000 filed on Jun. 18, 2021, which claims priority to Chinese Patent Application No. 202010806232.1 filed on Aug. 12, 2020. The disclosures of these applications are hereby incorporated by reference in their entirety.

BACKGROUND

A register file structure is a common data structure in a computer architecture, and is mainly applied to data transmission between two different systems. Data transmission technology using a register file structure includes a first in first out register queue structure. With a First In First Out (FIFO) queue, in a process of data transmission, data input and data output may be implemented at the same time when input and output are performed in parallel.

SUMMARY

The present disclosure relates to a First In First Out (FIFO) memory and a memory device.

According to a plurality of embodiments, a first aspect of the present disclosure provides a First In First Out (FIFO) memory, including storage units.

Outputs of the storage units are connected to one node.

A storage unit of the storage units includes storage sub-units, a selector, and a drive. An input of the selector is connected to outputs of the storage sub-units. An input of the drive is connected to an output of the selector. Driven by a first pointer signal, the storage sub-units receive storage data. Driven by a second pointer signal, the drive outputs the storage data.

According to a plurality of embodiments, a second aspect of the present disclosure provides a memory device including the FIFO memory as described in any embodiment of the present disclosure, for storing an address of a write operation.

Details of one or more embodiments of the present disclosure are set forth in drawings and description as follows. Other features and advantages of the present disclosure will become apparent from the description, the drawings, and the claims.

BRIEF DESCRIPTION OF THE DRAWINGS

Drawings to be used in describing embodiments of the present disclosure or conventional art are introduced briefly for clearer illustration of a technical solution in the embodiments or the conventional art. Note that the drawings described below refer merely to some embodiments of the present disclosure. For a person having ordinary skill in the art, other drawings may be acquired according to the drawings herein without creative effort.

LIST OF REFERENCE SIGNS storage unit 100; storage sub-unit 10; selector 20; drive 30; first counter circuit 40; first counter 41; first pointer signal generator 42; second counter circuit 50; second counter 51; second pointer signal generator 52; node storage unit 60; latch 61; first storage unit 101; and second storage unit 102.

DETAILED DESCRIPTION

To facilitate understanding the present disclosure, the present disclosure will be described more comprehensively below with reference to a related drawing. Preferred embodiments of the present disclosure are provided in the drawings. However, the present disclosure may be implemented in various forms, which is not limited to the embodiments described herein. On the contrary, these embodiments are provided to provide a more thorough and comprehensive disclosure of content herein.

Unless otherwise defined, all technical and scientific terms used herein have the same meanings as commonly understood by those skilled in the art of the present disclosure. Terms used in the specification of the present disclosure are for the mere purpose of describing a specific embodiment, and are not intended to limit the present disclosure.

In addition, certain terms used throughout the specification and the following claims refer to specific components. Those skilled in the art will understand that manufacturers may refer to components with different names. The present disclosure is not intended to distinguish components with different names but the same function. In the following description and embodiments, terms "include" and "comprise" are both open in use, and thus should be interpreted as "include, but be not limit to . . . ". Similarly, the term "connect" is intended to refer to indirect or direct electrical connection. Correspondingly, if one piece of equipment is connected to another, the connection may be achieved through a direct electrical connection, or through an indirect electrical connection with other equipment and connectors.

It is to be understood that although terms "first", "second" and the like may be used here to describe various components, these components are not limited by these terms.

These terms are used merely to distinguish one component from another component. For example, without departing from the scope of the present disclosure, a first component may be referred to as a second component, and similarly, a second component may be referred to as a first component.

In designing a circuit of a memory device, as a write operation of data writing generally has a large delay, in order to improve efficiency in writing data to the memory device, a FIFO queue is generally used to store an address of the write operation. With improving performance and data storage capacity of the memory device, there is an increasingly high requirement on a speed of data reading and writing.

The more the bits of data transmitted using a FIFO queue in a memory device, the greater the delay in a data write operation, which impacts efficiency in data transmission and reduces efficiency in writing data to the memory device. Various embodiments of the disclosure can address how to further reduce the delay in data output in a FIFO queue, to improve efficiency in data transmission and efficiency in writing data to the memory device.

Figure 1:
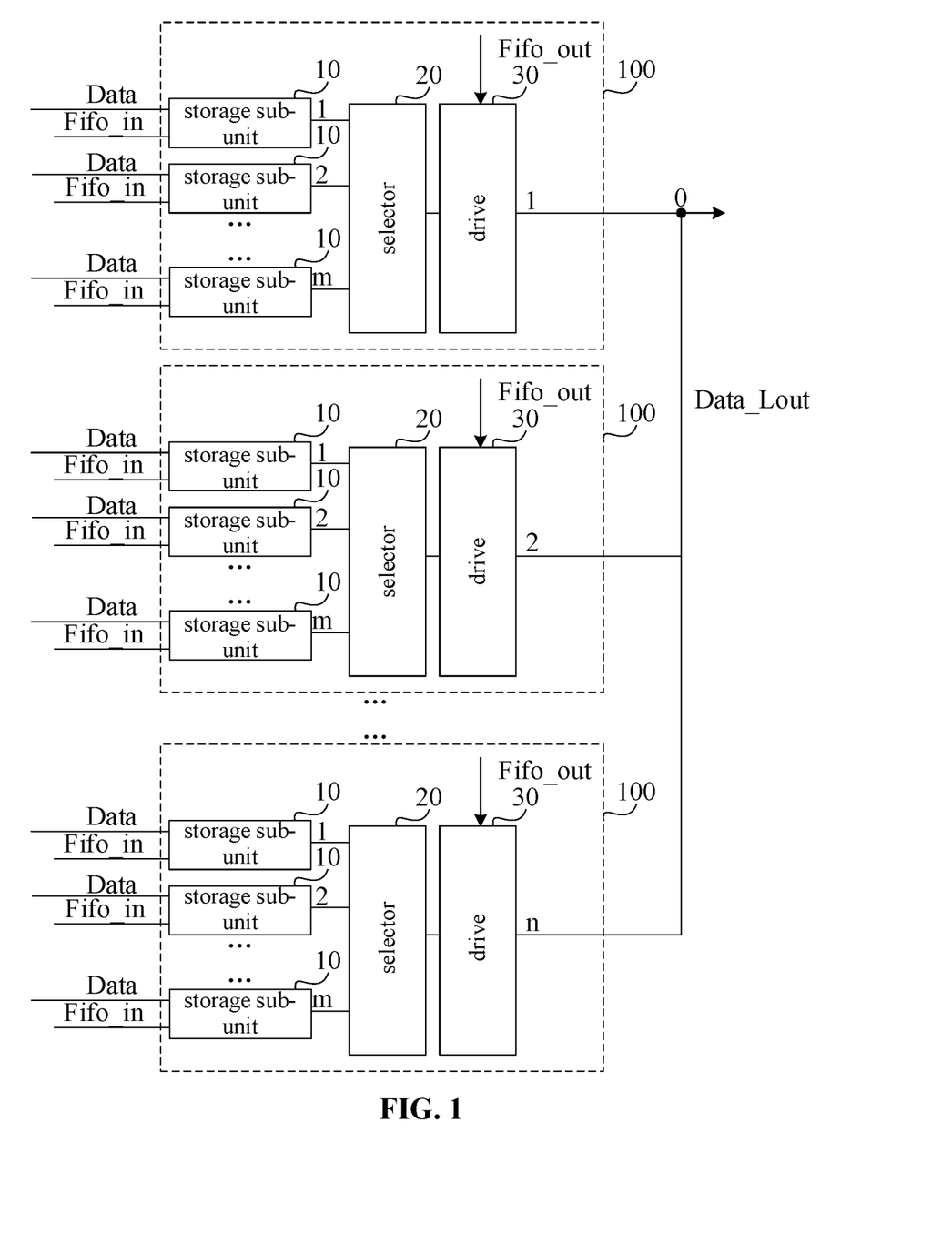
FIG. 1 is a block diagram of a FIFO memory according to a first embodiment of the present disclosure.

Referring to FIG. 1, a FIFO memory according to an embodiment of the present disclosure includes multiple storage units 100. Outputs of the storage units 100 are all connected to the same node O. Each storage unit 100 includes storage sub-units 10, a selector 20, and a drive 30. An input of the selector 20 is connected to outputs of the storage sub-units 10. An input of the drive 30 is connected to an output of the selector 20. Driven by a first pointer signal Fifo_in, the storage sub-unit 10 receives storage data Data. Driven by a second pointer signal Fifo_out, the drive 30 outputs the storage data.

As an example, referring again to FIG. 1, the FIFO memory includes n storage units 100. The output of each storage unit 100 is connected to the same node O. One storage unit 100 includes m storage sub-units 10, a selector 20, and a drive 30. The output of each storage sub-unit 10 in one storage unit 100 is connected to the input of the selector 20. The input of the drive 30 is connected to the output of the selector 20. The m is an integer greater than or equal to 1. The n is an integer greater than or equal to 1. Each storage sub-unit 10 receives storage data "Data" driven by a first pointer signal Fifo_in. Each drive 30 outputs the storage data driven by a second pointer signal Fifo_out.

Specifically, in the FIFO memory in the embodiment, it is set that the input of the selector 20 is connected to the outputs of the multiple storage sub-units 10, and the input of the drive 30 is connected to the output of the selector. Accordingly, the storage sub-units 10 receive, as driven by the first pointer signal Fifo, the storage data "Data"; and the drive 30 outputs, as driven by the second pointer signal Fifo_out, the storage data. Thus, the length of a data line Data_Lout that is connected to all the outputs of the storage units 100 is reduced, reducing a delay in data transmission in the FIFO memory, while ensuring data transmission capacity of the FIFO memory, thereby effectively improving efficiency in data transmission in the FIFO memory.

Figure 2:
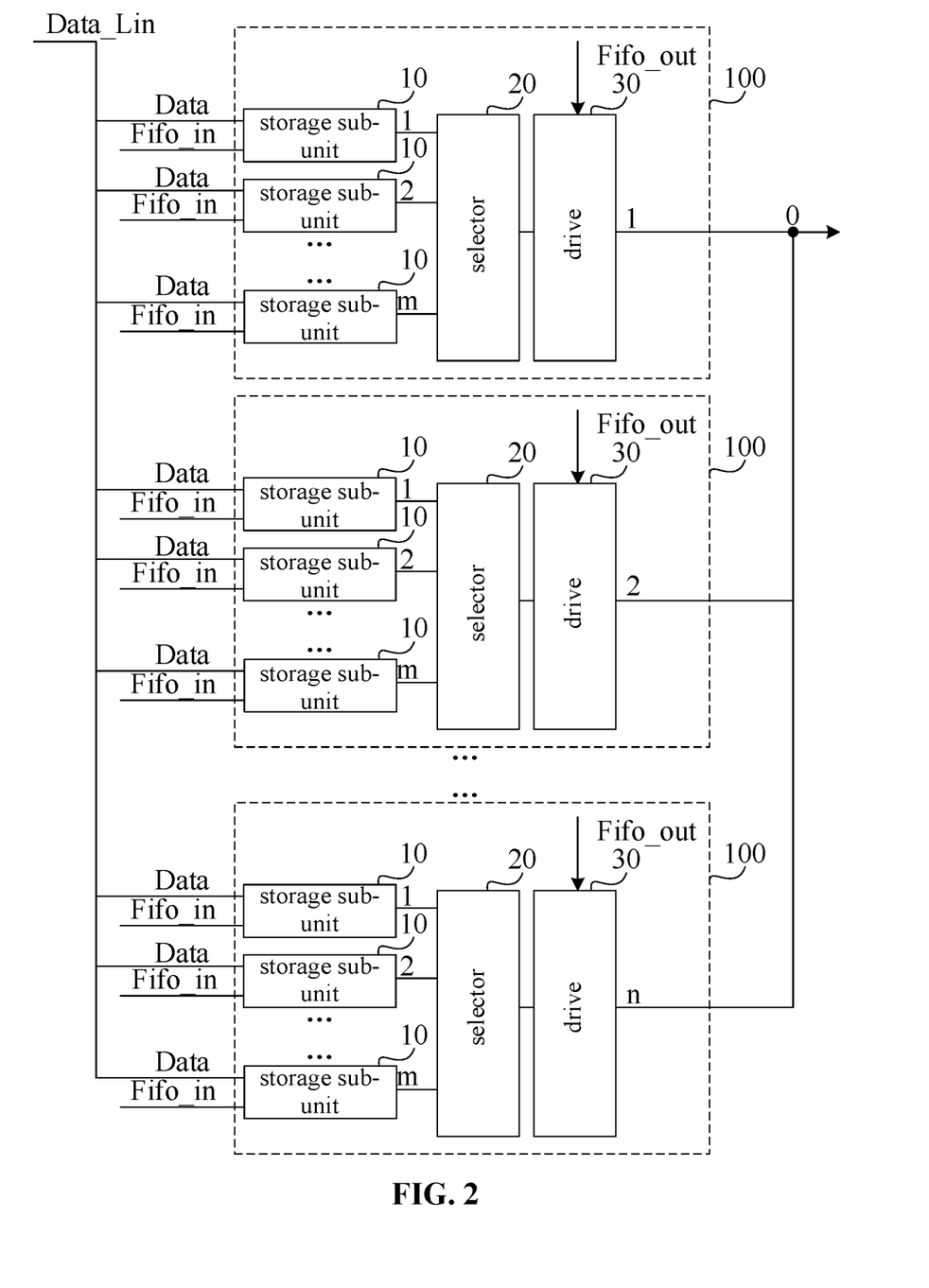
FIG. 2 is a block diagram of a FIFO memory according to a second embodiment of the present disclosure.

Further, in an embodiment of the present disclosure, referring to FIG. 2, data inputs of the multiple storage sub-units 10 are all connected to the same data signal line Data_Lin, facilitating input of Data to the storage sub-units 10 through the data signal line Data_Lin, improving efficiency in data transmission while simplifying a circuit structure.

Figure 3:
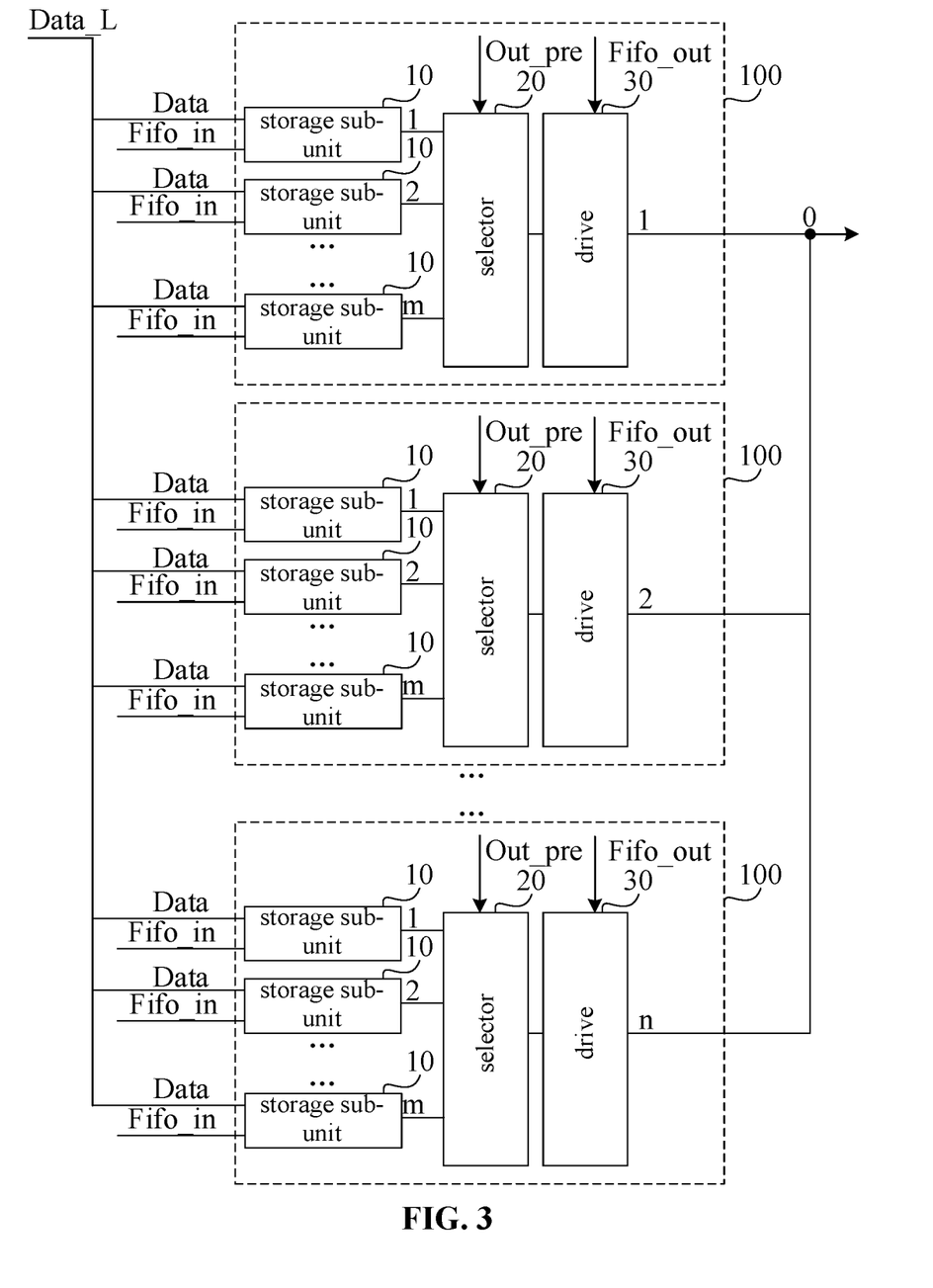
FIG. 3 is a block diagram of a FIFO memory according to a third embodiment of the present disclosure.

Further, in an embodiment of the present disclosure, referring to FIG. 3, control terminals of selectors 20 are all connected to the same selecting clock line Out_pre, facilitating input of a control signal to different selectors 20 through the selecting clock line Out_pre, improving efficiency in signal transmission while simplifying a circuit structure.

Figure 4:
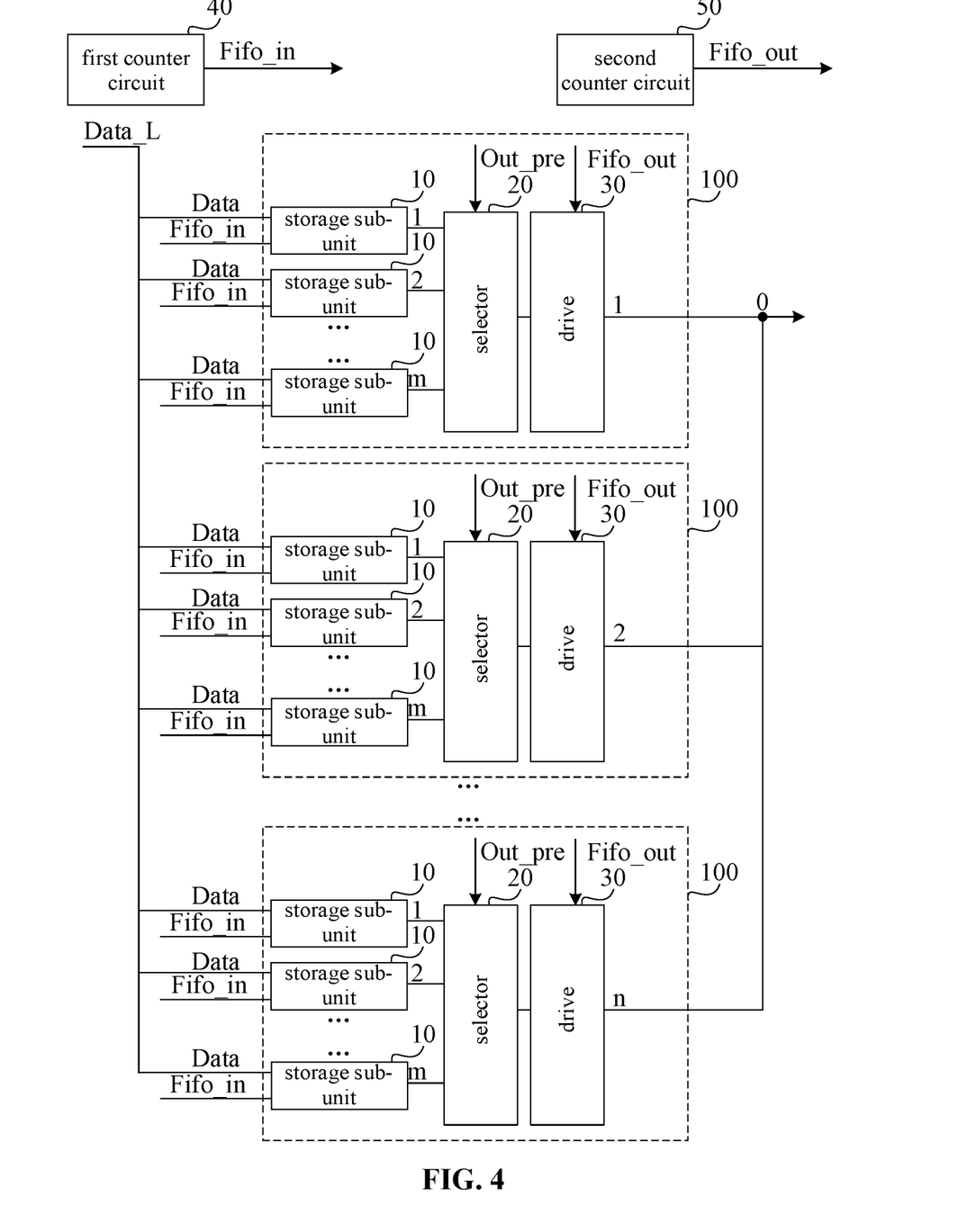
FIG. 4 is a block diagram of a FIFO memory according to a fourth embodiment of the present disclosure.

Further, in an embodiment of the present disclosure, referring to FIG. 4, the first pointer signal Fifo_in is generated by a first counter circuit 40, the second pointer signal Fifo_out is generated by a second counter circuit 50, and a drive clock rate of the first counter circuit 40 and a drive clock rate of the second counter circuit 50 are identical, so that input data and output data of the FIFO memory are transmitted at the same rate, implementing simultaneous data input and output.

Further, in an embodiment of the present disclosure, referring again to FIG. 4, a counting cycle number of the first counter circuit 40 and a counting cycle number of the second counter circuit 50 are identical, such that input data and output data of the FIFO memory transmit bytes of the same number of bits, allowing the output data and the input data of the FIFO memory to be consistent, ensuring accuracy in data transmission.

Figure 5:
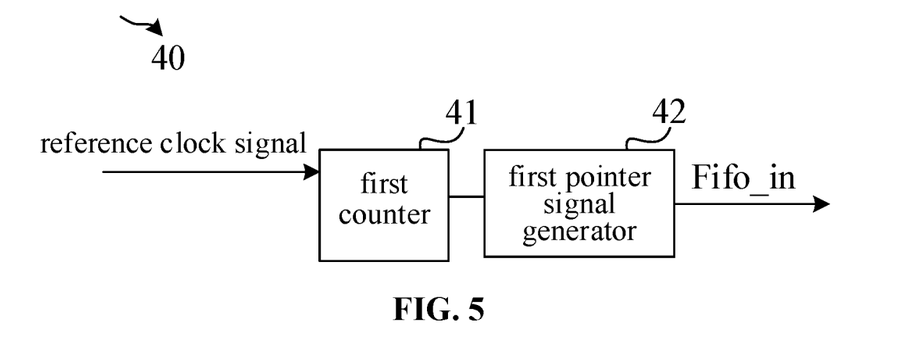
FIG. 5 is a block diagram of a first counter circuit in a FIFO memory according to a fifth embodiment of the present disclosure.

Further, in an embodiment of the present disclosure, referring to FIG. 5, the first counter circuit 40 includes a first counter 41 and a first pointer signal generator 42. The first counter 41 is configured to count clock cycles of a reference clock signal. The counting cycle number of the first counter 41 may be equal to a total number of the storage sub-units. The first pointer signal generator 42 may be connected to the first counter 41, and may be configured to generate the first pointer signal Fifo_in.

Specifically, in the FIFO memory according to the embodiment, the first counter 41 is set to count clock cycles of a reference clock signal, and the counting cycle number of the first counter 41 is set to be equal to a total number of the storage sub-units, allowing the first pointer signal generator 42 to sequentially generate the first pointer signal Fifo_in based on the count acquired by the first counter 41, to sequentially drive different storage sub-units to receive storage data, implementing serial input of the data. The first counter is set to count clock cycles of the reference clock signal, allowing the FIFO memory to subsequently drive data output with the same reference, ensuring the same transmission rate for input data and output data.

Further, in an embodiment of the present disclosure, the first pointer signal includes a number of sub-input clock signals equal to the counting cycle number. The sub-input clock signals may be asynchronous clock signals, allowing the sub-input clock signals to sequentially drive different storage sub-units to receive storage data, implementing serial input of the data.

Figure 6:
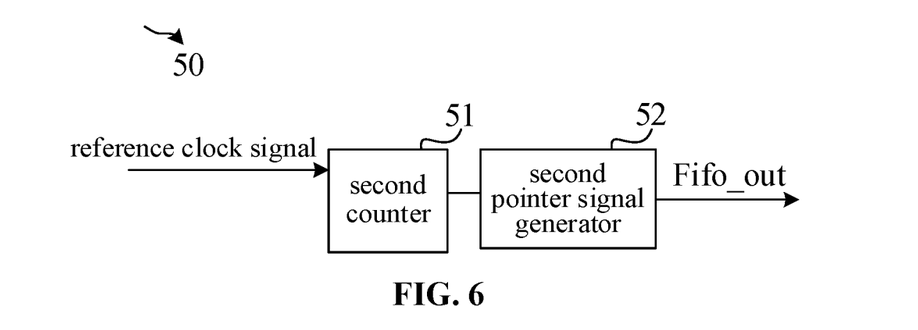
FIG. 6 is a block diagram of a second counter circuit in a FIFO memory according to a sixth embodiment of the present disclosure.

Further, in an embodiment of the present disclosure, referring to FIG. 6, the second counter circuit 50 includes a second counter 51 and a second pointer signal generator 52. The second counter 51 may be configured to count clock cycles of a reference clock signal. The counting cycle number of the second counter 51 may be equal to a total number of the storage sub-units. The second pointer signal generator 52 may be connected to the second counter 51, and may be configured to generate the second pointer signal Fifo_out.

Specifically, in the FIFO memory according to the embodiment, the second counter 51 is set to count clock cycles of a reference clock signal, and the counting cycle number of the second counter 51 is set to be equal to a total number of the storage sub-units, allowing the second pointer signal generator 52 to sequentially generate the second pointer signal Fifo_out based on the count acquired by the second counter 51, to sequentially drive different drives to output data, implementing serial output of the data. The second counter 51 is set to count clock cycles of the reference clock signal, allowing the FIFO memory to subsequently drive data output with the same reference as the reference clock signal of the first pointer signal, ensuring the same transmission rate for input data and output data.

Further, in an embodiment of the present disclosure, the second pointer signal includes a number of output clock trigger signals equal to the counting cycle number, and the output clock trigger signals are configured to drive the drive to output storage data.

Figure 7:
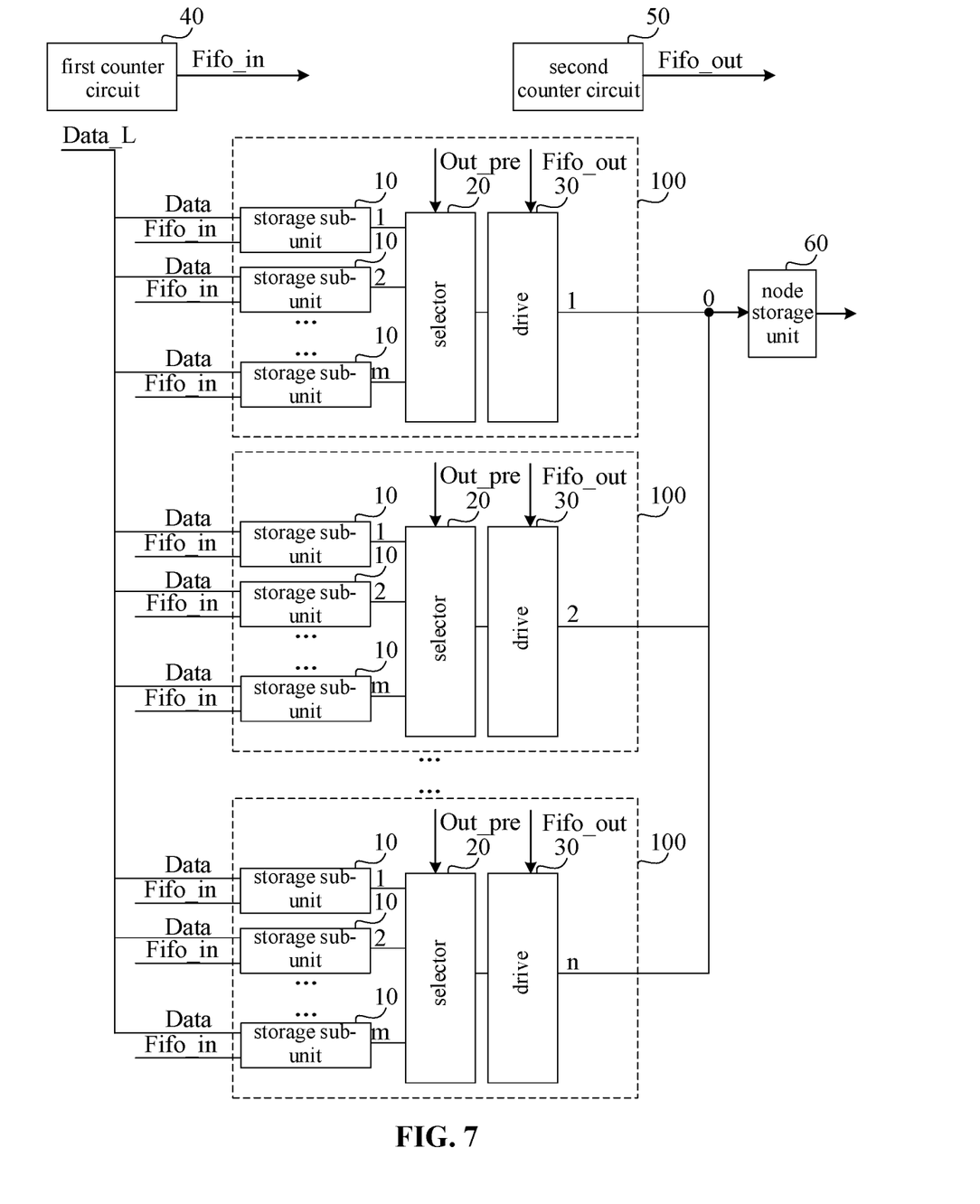
FIG. 7 is a block diagram of a FIFO memory according to a seventh embodiment of the present disclosure.

Further, in an embodiment of the present disclosure, referring to FIG. 7, the FIFO memory further includes a node storage unit 60. An input of the node storage unit 60 may be connected to the same node O, allowing the node storage unit 60 to store or cache data output by a drive 30.

Further, in an embodiment of the present disclosure, the storage sub-unit and/or the node storage unit includes one or more of a trigger, a latch, and a register.

Figure 8:
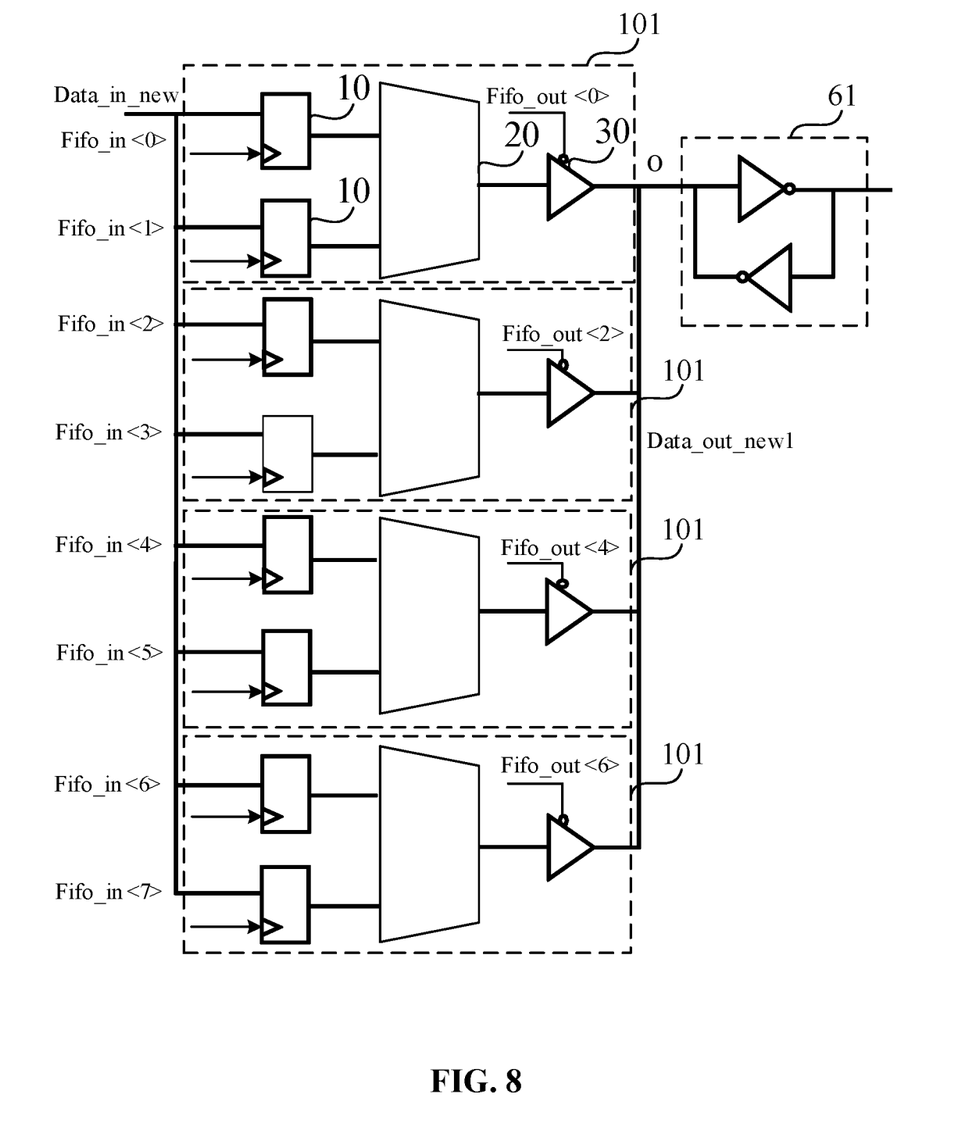
FIG. 8 is a diagram of a circuit of a FIFO memory according to an eighth embodiment of the present disclosure.

As an example, in an embodiment of the present disclosure, referring to FIG. 8, the FIFO memory includes four first storage units 101. Outputs of the first storage units 101 may all be connected to the same node O. A first storage unit 101 may include two storage sub-units 10, a selector 20, and a drive 30. Outputs of the storage sub-units 10 in each first storage unit 101 may all be connected to the input of the selector 20, and the input of the drive 30 may be connected to the output of the selector 20. Driven by a first pointer signal Fifo_in, a storage sub-unit 10 may receive storage data Data_in_new. Driven by a second pointer signal Fifo_out, a drive 30 may output the storage data. Outputs of drives 30 may all be connected to a first data output signal line Data_out_new1.

Further, in an embodiment of the present disclosure, referring again to FIG. 8, the node storage unit may include a latch 61. The input of the latch 61 may be connected to the node O. The latch 61 may be configured to store or cache data output by a drive 30.

Figure 9:
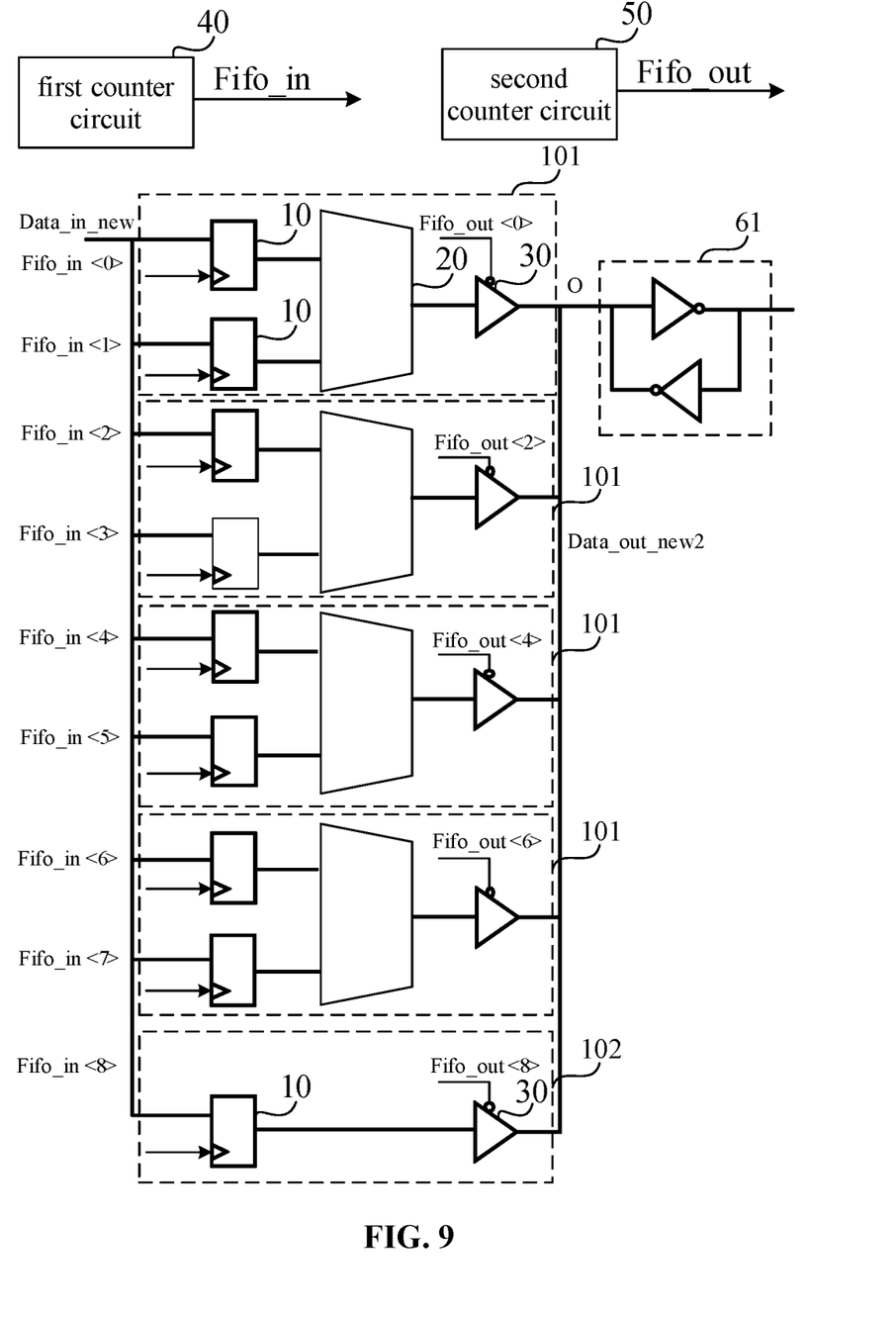
FIG. 9 is a diagram of a circuit of a FIFO memory according to a ninth embodiment of the present disclosure.

As an example, in an embodiment of the present disclosure, referring to FIG. 9, the difference over the embodiment shown in FIG. 8 lies in that in addition to the four first storage units 101, the FIFO memory further includes a second storage unit 102. The second storage unit 102 may include one storage sub-unit 10 and a drive 30. The input of the drive 30 may be connected to an output of the storage sub-unit 10. Driven by a second pointer signal Fifo_out, the drive 30 may output storage data. Outputs of drives 30 may all be connected to a second data output signal line Data_out_new2.

Figure 10:
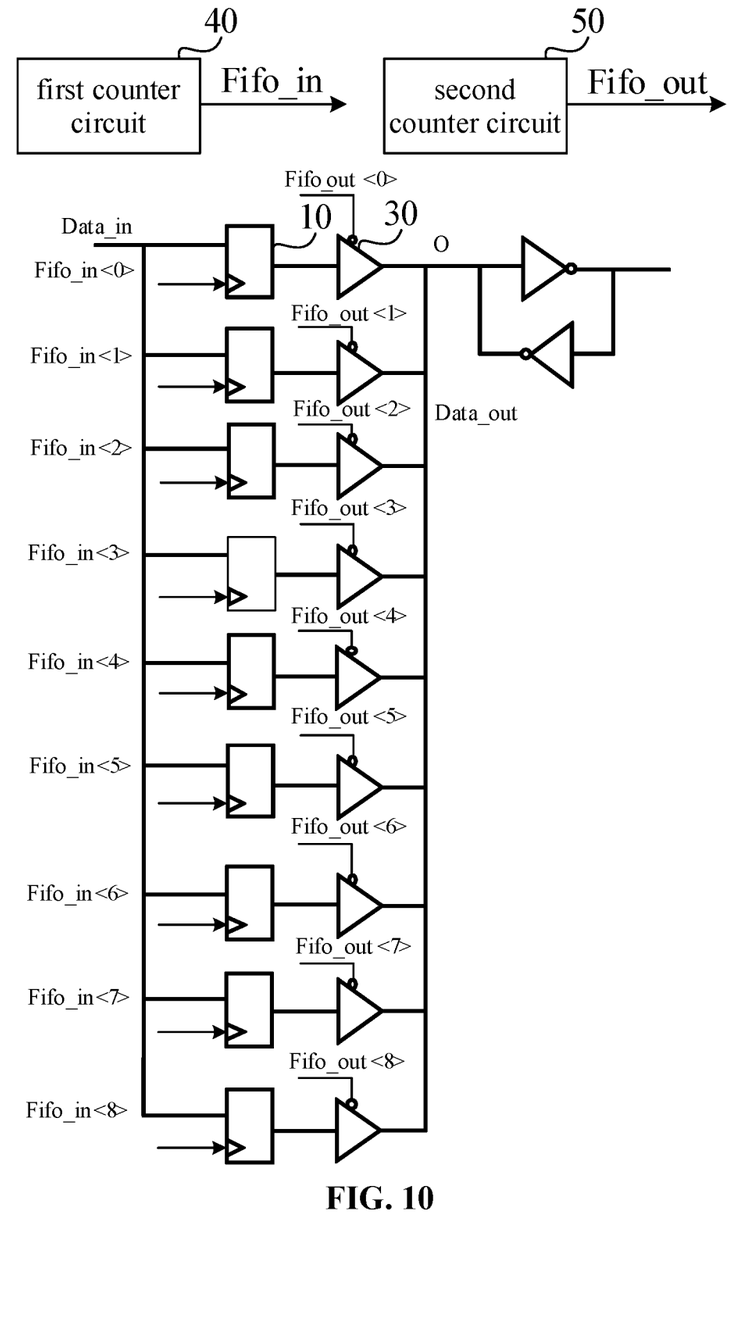
FIG. 10 is a diagram of a circuit of a FIFO memory.

FIG. 10 is a diagram of a structure of a FIFO resistor queue. Outputs of the drives 30 may all be connected to a data output signal line Data_out. Comparing FIG. 9 and FIG. 10, it may be clear that when transmitting data of the same number of bytes, the length of the second data output signal line Data_out_new2 in FIG. 9 is significantly less than the length of the data output signal line Data_out in FIG. 10. Thus, with the same input signal transmission rate and the same transmission byte length, a delay in data transmission in a register device in FIG. 9 is significantly less than a delay in data transmission in the FIFO register queue in FIG. 10.

Figure 11:
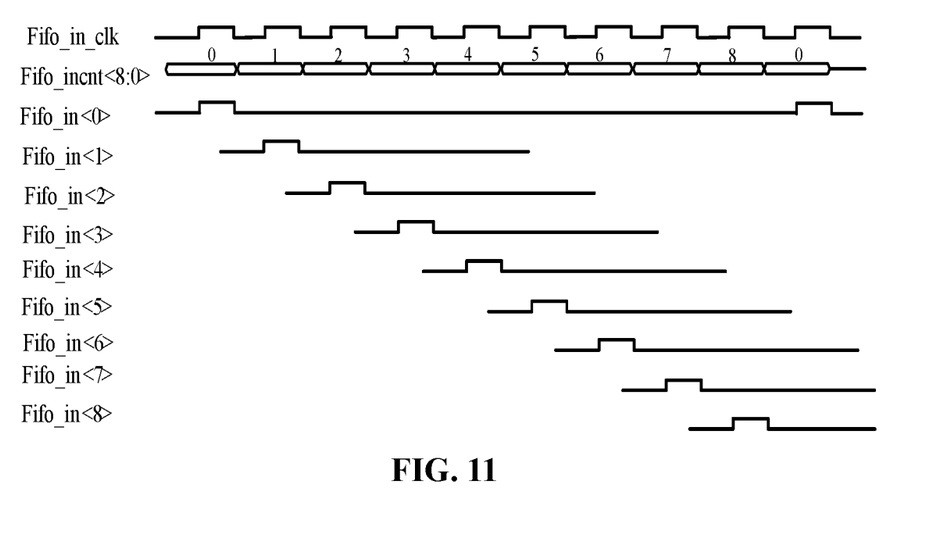
FIG. 11 is a diagram of timing of a first pointer signal of a FIFO memory according to a tenth embodiment of the present disclosure.
Figure 12:
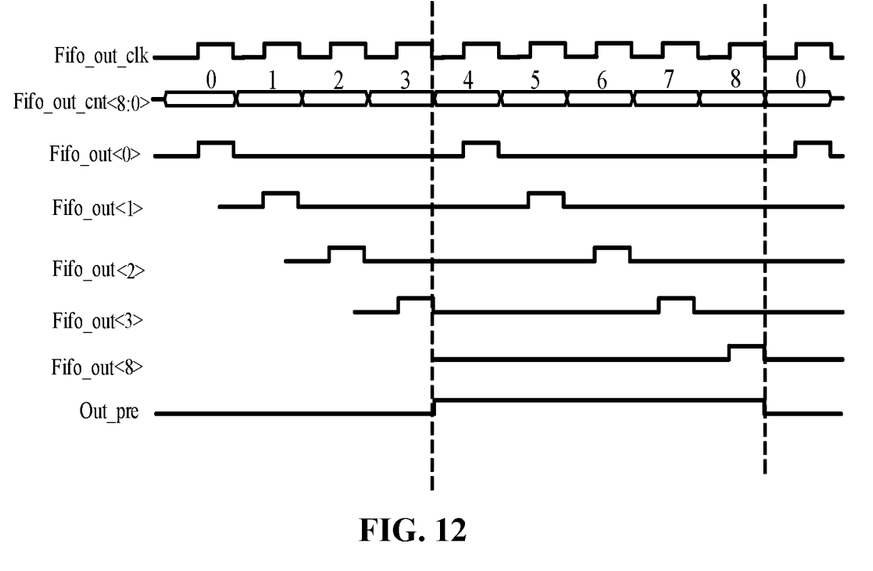
FIG. 12 is a diagram of timing of a second pointer signal of a FIFO memory according to an eleventh embodiment of the present disclosure.

As an example, referring to FIG. 9, FIG. 11, and FIG. 12, the working principle of the present disclosure is briefly described with reference to specific timing diagrams. The first counter 41 counts clock cycles of a reference clock signal Fifo_in_clk, and a counting cycle number of the first counter 41 is equal to the total number 9 of the storage sub-units 10. The first pointer signal generator 42 is connected to the first counter 41, and is configured to generate a first pointer signal Fifo_in. The first pointer signal Fifo_in includes a number of sub-input clock signals equal to the counting cycle number. As shown in FIG. 11, the first pointer signal Fifo_in includes a total of 9 asynchronous sub-input clock signals Fifo_in<0>, Fifo_in<1>, Fifo_in<2>, Fifo_in<3>, Fifo_in<4>, Fifo_in<5>, Fifo_in<6>, Fifo_in<7>, and Fifo_in<8>. The first pointer signal generator 42 generates the first sub-input clock signal Fifo_in<0> when the count acquired by the first counter 41 is 0. The first pointer signal generator 42 generates the second sub-input clock signal Fifo_in<1> when the count acquired by the first counter 41 is 1. The first pointer signal generator 42 generates the third sub-input clock signal Fifo_in<2> when the count acquired by the first counter 41 is 2. The first pointer signal generator 42 generates the fourth sub-input clock signal Fifo_in<3> when the count acquired by the first counter 41 is 3. The first pointer signal generator 42 generates the fifth sub-input clock signal Fifo_in<4> when the count acquired by the first counter 41 is 4. The first pointer signal generator 42 generates the sixth sub-input clock signal Fifo_in<5> when the count acquired by the first counter 41 is 5. The first pointer signal generator 42 generates the seventh sub-input clock signal Fifo_in<6> when the count acquired by the first counter 41 is 6. The first pointer signal generator 42 generates the eighth sub-input clock signal Fifo_in<7> when the count acquired by the first counter 41 is 7. The first pointer signal generator 42 generates the ninth sub-input clock signal Fifo_in<8> when the count acquired by the first counter 41 is 8. Accordingly, the sub-input clock signals may sequentially drive different storage sub-units to receive storage data, implementing serial input of the data. The second counter 51 counts clock cycles of a reference clock signal Fifo_out_clk, and a counting cycle number of the second counter 51 is equal to the total number 9 of the storage sub-units 10. The second pointer signal generator 52 is connected to the second counter 51, and is configured to generate a second pointer signal Fifo_out. The second pointer signal Fifo_out includes a first sub-output clock signal Fifo_out<0>, a second sub-output clock signal Fifo_out<1>, a third sub-output clock signal Fifo_out<2>, a fourth sub-output clock signal Fifo_out<3>, and an eighth sub-output clock signal Fifo_out<8>. The first sub-output clock signal Fifo_out<0>, the second sub-output clock signal Fifo_out<1>, the third sub-output clock signal Fifo_out<2>, and the fourth sub-output clock signal Fifo_out<3> each include two synchronous output clock trigger signals in one counting cycle of the second counter 51, and the eighth sub-output clock signal Fifo_out<8> includes one output clock trigger signal in one counting cycle of the second counter 51. That is, the second pointer signal Fifo_out includes nine output clock trigger signals. An output clock trigger signal in FIG. 12 may be of a rising edge waveform or of a pulse waveform. In one counting cycle of the second counter 51, when a clock selection signal Out_pre input at control terminals of the selectors 20 is of a low level, the drives 30 in FIG. 9 sequentially output storage data input as driven by Fifo_in<0>, Fifo_in<2>, Fifo_in<4>, and Fifo_in<6>. In one counting cycle of the second counter 51, when the clock selection signal Out_pre input at the control terminals of the selectors 20 is of a high level, the drives 30 in FIG. 9 sequentially output storage data input as driven by Fifo_in<1>, Fifo_in<3>, Fifo_in<5>, Fifo_in<7>, and Fifo_in<8>, implementing asynchronous output of the data.

Further, in an embodiment of the present disclosure, there is provided a memory device including the FIFO memory as described in any embodiment of the present disclosure, for storing an address of a write operation. By connecting an input of the selector to outputs of multiple storage sub-units, and connecting an input of the drive to an output of the selector, it is implemented that, the storage sub-units, as driven by a first pointer signal, receive storage data; and the drive, driven by a second pointer signal, output the storage data. Thus, the length of a data line that is connected to all the outputs of the storage units is reduced, reducing a delay in data transmission in the FIFO memory in the memory device while ensuring data transmission capacity of the FIFO memory in the memory device, thereby effectively improving efficiency in data transmission of the memory device.

Refer to the definition of the FIFO memory herein for the specific definition of the memory device in the embodiment, which is not repeated here.

It is to be noted that embodiments here are merely for illustrative purposes and are not intended to limit the present disclosure.

The memory device according to the embodiments includes, but is not limited to DRAM, SDRAM, SRAM, DDR SDRAM, DDR2 SDRAM, DDR3 SDRAM, DDR4 SDRAM, LPDDR4 SDRAM, DDR5 SDRAM, LPDDR5 SDRM, GDDR5 SDRAM, GDDR6 SDRAM, PRAM, MRAM, and RRAM.

Various technical features of the embodiments may be combined arbitrarily. For conciseness of description, not all possible combinations of the various technical features of the embodiments are described. However, a combination of technical features shall be deemed to fall within the scope of the description as long as there is no contradiction in the combination of the technical features.

The embodiments herein are just several implementations of the present disclosure, and are described in details. However, they shall not be construed as limiting the scope of the present disclosure. Note that a person having ordinary skill in the art may make various modifications and improvements without departing from the concept of the present disclosure. Such modifications and improvements also fall in the protection scope of the present disclosure. Therefore, the scope of the present disclosure is defined by the appended claims.

What is claimed is:

1. A First In First Out (FIFO) memory, comprising:
storage units, outputs of the storage units being connected to one node;
a storage unit of the storage units comprising storage sub-units, a selector, and a drive; an input of the selector being connected to outputs of the storage sub-units; an input of the drive being connected to an output of the selector; driven by a first pointer signal, the storage sub-units receiving storage data; driven by a second pointer signal, the drive outputting the storage data,
wherein the first pointer signal is generated by a first counter circuit, the second pointer signal is generated by a second counter circuit, and a drive clock rate of the first counter circuit and a drive clock rate of the second counter circuit are identical.

2. The FIFO memory of claim 1, wherein data inputs of the storage sub-units are connected to one data signal line.

3. The FIFO memory of claim 1, wherein a control terminal of the selector is connected to one selecting clock line.

4. The FIFO memory of claim 1, wherein a counting cycle number of the first counter circuit and a counting cycle number of the second counter circuit are identical.

5. The FIFO memory of claim 4, wherein the first counter circuit comprises a first counter and a first pointer signal generator,
wherein the first counter is configured to count clock cycles of a reference clock signal, the counting cycle number of the first counter being equal to a total number of the storage sub-units,
wherein the first pointer signal generator is connected to the first counter, and is configured to generate the first pointer signal.

6. The FIFO memory of claim 5, wherein the first pointer signal comprises a number of sub-input clock signals equal to the counting cycle number,
wherein the sub-input clock signals are asynchronous clock signals.

7. The FIFO memory of claim 4, wherein the second counter circuit comprises a second counter and a second pointer signal generator,
wherein the second counter is configured to count clock cycles of a reference clock signal, the counting cycle number of the second counter being equal to a total number of the storage sub-units,
wherein the second pointer signal generator is connected to the second counter, and is configured to generate the second pointer signal.

8. The FIFO memory of claim 7, wherein the second pointer signal comprises a number of output clock trigger signals equal to the counting cycle number, and the output clock trigger signals are configured to drive the drive to output the storage data.

9. The FIFO memory of claim 1, further comprising a node storage unit, wherein an input of the node storage unit is connected to the one node.

10. The FIFO memory of claim 9, wherein the storage sub-units and/or the node storage unit comprises one or more of a trigger, a latch, and a register.

11. The FIFO memory of claim 1, wherein the storage units comprise four first storage units; outputs of the four first storage units are connected to the one node; each of the four first storage units comprises two storage sub-units, the selector, and the drive; outputs of the two storage sub-units in the each of the four first storage units are connected to the input of the selector, and the input of the drive is connected to the output of the selector.

12. The FIFO memory of claim 1, wherein the storage units further comprise a second storage unit, the second storage unit comprises one storage sub-unit and the drive, and the input of the drive is connected to an output of the one storage sub-unit.

13. The FIFO memory of claim 2, wherein a counting cycle number of the first counter circuit and a counting cycle number of the second counter circuit are identical.

14. The FIFO memory of claim 13, wherein the first counter circuit comprises a first counter and a first pointer signal generator,
wherein the first counter is configured to count clock cycles of a reference clock signal, the counting cycle number of the first counter being equal to a total number of the storage sub-units,
wherein the first pointer signal generator is connected to the first counter, and is configured to generate the first pointer signal.

15. The FIFO memory of claim 14, wherein the first pointer signal comprises a number of sub-input clock signals equal to the counting cycle number,
wherein the sub-input clock signals are asynchronous clock signals.

16. The FIFO memory of claim 13, wherein the second counter circuit comprises a second counter and a second pointer signal generator,
wherein the second counter is configured to count clock cycles of a reference clock signal, the counting cycle number of the second counter being equal to a total number of the storage sub-units,
wherein the second pointer signal generator is connected to the second counter, and is configured to generate the second pointer signal.

17. A memory device, comprising the FIFO memory of claim 1, and being configured to store an address of a write operation.

\* \* \* \* \*